(12) United States Patent
Morinaga et al.

(10) Patent No.: US 10,199,486 B2
(45) Date of Patent: Feb. 5, 2019

(54) SEMICONDUCTOR DEVICE

(71) Applicant: SHINDENGEN ELECTRIC MANUFACTURING CO., LTD., Chiyoda-ku (JP)

(72) Inventors: Yuji Morinaga, Hanno (JP); Atsushi Kyutoku, Hanno (JP); Yoshihiko Kikuchi, Hanno (JP)

(73) Assignee: SHINDENGEN ELECTRIC MANUFACTURING CO., LTD., Chiyoda-ku (JP)

(*) Notice: Subject to any disclaimer, the term of this patent is extended or adjusted under 35 U.S.C. 154(b) by 0 days.

(21) Appl. No.: 15/738,437

(22) PCT Filed: Jun. 19, 2017

(86) PCT No.: PCT/JP2017/022567
§ 371 (c)(1),
(2) Date: Dec. 20, 2017

(65) Prior Publication Data
US 2018/0366567 A1    Dec. 20, 2018

(51) Int. Cl.
*H01L 29/778* (2006.01)
*H01L 29/66* (2006.01)
(Continued)

(52) U.S. Cl.
CPC .......... *H01L 29/778* (2013.01); *H01L 23/528* (2013.01); *H01L 29/2003* (2013.01); *H01L 29/66431* (2013.01); *H02M 3/335* (2013.01)

(58) Field of Classification Search
CPC . H01L 29/778; H01L 29/2003; H01L 23/528; H01L 29/66431; H02M 3/335
See application file for complete search history.

(56) References Cited

U.S. PATENT DOCUMENTS

| 6,501,172 B1 | 12/2002 | Fukada et al. |
| 2002/0186545 A1 | 12/2002 | Fukada et al. |

(Continued)

FOREIGN PATENT DOCUMENTS

| JP | 62-150871 A | 7/1987 |
| JP | 2001-332679 A | 11/2001 |

(Continued)

OTHER PUBLICATIONS

International Search Report dated Aug. 29, 2017 in PCT/JP2017/022567 filed Jun. 19, 2017 (with English translation of categories of cited documents).

*Primary Examiner* — Selim Ahmed
(74) *Attorney, Agent, or Firm* — Oblon, McClelland, Maier & Neustadt, L.L.P.

(57) ABSTRACT

A semiconductor device 1 of an embodiment is provided, including an insulating substrate 2, conductive pattern parts 51, 52, 53, 54, and 55 formed on the insulating substrate, a GaN-HEMI 10 disposed on the conductive pattern part 51, and a GaN-HEMT 20 disposed on the conductive pattern part 52, wherein an imaginary line L1 of the GaN-HEMT 10 and an imaginary line L2 of the GaN-HEMT 20 intersect each other, a GaN gate electrode 23 of the GaN-HEMT 20 is electrically connected to the conductive pattern part 55 via a metal wire 6, and the metal wire 6 is perpendicular to a side 55 of the GaN-HEMT 20 and a conductive pattern side 55S of the conductive pattern part 55.

12 Claims, 3 Drawing Sheets

(51) Int. Cl.
*H02M 3/335* (2006.01)
*H01L 23/528* (2006.01)
*H01L 29/20* (2006.01)

(56) References Cited

U.S. PATENT DOCUMENTS

| | | |
|---|---|---|
| 2011/0148337 A1 | 6/2011 | Yamada |
| 2014/0231926 A1* | 8/2014 | Okumura ................ H01L 25/04 |
| | | 257/401 |
| 2015/0108664 A1 | 4/2015 | Okumura |
| 2016/0293597 A1* | 10/2016 | Curatola ............. H01L 29/7786 |
| 2016/0380531 A1* | 12/2016 | Kataoka .............. H02M 1/4225 |
| | | 323/210 |

FOREIGN PATENT DOCUMENTS

| | | |
|---|---|---|
| JP | 2009-88466 A | 4/2009 |
| JP | 2011-243808 A | 12/2011 |
| JP | 2015-29040 A | 2/2015 |
| WO | WO 2013/046824 A1 | 4/2013 |
| WO | WO 2015/040727 A1 | 3/2015 |

* cited by examiner

SEMICONDUCTOR DEVICE

TECHNICAL FIELD

The present invention relates to a semiconductor device having a power supply circuit

BACKGROUND ART

There are known semiconductor devices having power supply circuits which convert a power supply voltage into a desired voltage and output the voltage. Such power supply circuits are an inverter, a rectifier, a DC/DC converter and the like. Such semiconductor devices are used, for example, for a power conditioner of a solar power generation system, a server device, and the like. For the power supply circuit in the semiconductor device, a half bridge circuit or a full bridge circuit is used. Each of these circuits has a structure in which semiconductor switching elements are in cascade connection.

In order to enhance power conversion efficiency of such a power supply circuit, it has been being investigated in recent years that high electron mobility transistors (High Electron Mobility Transistors: HEMTs) using a GaN-based semiconductor material that enables operation at a high speed (for example, exceeding 100 MHz) (hereinafter, also referred simply as "GaN-HEMTs") are applied to the switching elements.

Notably, Patent Literature 1 discloses an LED driving device using GaN-HEMTs.

CITATION LIST

Patent Literature

Patent Literature 1: Japanese Patent Laid-Open No. 2015-029040

SUMMARY OF INVENTION

Technical Problem

In the case where the GaN-HEMTs are applied to the power supply circuit, this causes far more significant influence of a parasitic inductance in the wiring of the power supply circuit than conventional one due to higher speed operation. Therefore, there can be a concern that a malfunction of the power supply circuit arises.

Therefore, an object of the present invention is to provide a semiconductor device capable of suppressing a malfunction of a power supply circuit having GaN-HEMTs.

Solution to Problem

There is provided a semiconductor device according to the present invention including:
an insulating substrate;
a first conductive pattern part formed on the insulating substrate;
a second conductive pattern part formed on the insulating substrate;
a third conductive pattern part formed on the insulating substrate;
a fourth conductive pattern part formed on the insulating substrate;
a fifth conductive pattern part formed on the insulating substrate;
a first GaN-HEMT having a first GaN main electrode, a second GaN main electrode and a first GaN gate electrode and disposed on the first conductive pattern part;
a first MOS-FET having a first MOS main electrode, a second MOS main electrode and a first MOS gate electrode, the first MOS main electrode being electrically connected to the second GaN main electrode;
a second GaN-HEMT having a third GaN main electrode, a fourth GaN main electrode and a second GaN gate electrode and disposed on the second conductive pattern part;
a second MOS-FET having a third MOS main electrode, a fourth MOS main electrode and a second MOS gate electrode, the third MOS main electrode being electrically connected to the fourth GaN main electrode; and
a bypass capacitor having a first electrode and a second electrode,
the first GaN main electrode of the first GaN-HEMT being electrically connected to the third conductive pattern part, the second MOS main electrode of the first MOS-FET being electrically connected to the fourth conductive pattern part, the third GaN main electrode of the second GaN-HEMT being electrically connected to the fourth conductive pattern part, the fourth MOS main electrode of the second MOS-FET being electrically connected to the fifth conductive pattern part, the first electrode of the bypass capacitor being electrically connected to the third conductive pattern part, the second electrode of the bypass capacitor being electrically connected to the fifth conductive pattern part,
the first GaN-HEMT having a first side and a second side opposite to the first side, the second GaN-HEMT having a third side and a fourth side opposite to the third side,
the first GaN main electrode of the first GaN-HEMT being provided along the first side, the third GaN main electrode of the second GaN-HEMT being provided along the third side, a first imaginary line extending along the first side and a second imaginary line extending along the third side intersecting each other,
the second GaN-HEMT having a fifth side connecting the third side and the fourth side, the fifth conductive pattern part having a conductive pattern side opposite to the fifth side,
the second GaN gate electrode of the second GaN-HEMT being electrically connected to the fifth conductive pattern part via a connection member, the connection member being perpendicular to the fifth side and the conductive pattern side.

Moreover, in the semiconductor device, the first GaN-HEMT and the second GaN-HEMT may be normally-on transistors, and the first MOS-FET and the second MOS-FET may be normally-off transistors.

Moreover, in the semiconductor device, the connection member may be a metal wire or a connector.

Moreover, in the semiconductor device, the first GaN main electrode of the first GaN-HEMT may be electrically connected to a high voltage-side terminal via the third conductive pattern part, and the fourth MOS main electrode of the second MOS-FET may be electrically connected to a low voltage-side terminal via the fifth conductive pattern part.

Moreover, in the semiconductor device,
the insulating substrate may have a first substrate side from which the high voltage-side terminal and the low voltage-side terminal protrude in plan view, and a second substrate side opposite to the first substrate side, and the first GaN-HEMT may be disposed such that the first imaginary line is parallel to the first substrate side, and the second GaN-HEMT may be disposed such that the second imaginary line is oblique to the first substrate side.

Moreover, in the semiconductor device, an angle at which the first imaginary line and the second imaginary line intersect each other may be not less than 30° and not more than 60°.

Moreover, in the semiconductor device, an angle at which the first imaginary line and the second imaginary line intersect each other may be 45°.

Moreover, in the semiconductor device, the first GaN-HEMT may have a sixth side connecting the first side and the second side, and the fourth conductive pattern part may have a conductive pattern side opposite to the sixth side, and the first GaN gate electrode of the first GaN-HEMT may be electrically connected to the fourth conductive pattern part via a connection member, and the connection member may be perpendicular to the sixth side and the conductive pattern side.

Moreover, in the semiconductor device, the first MOS-FET may be disposed on the first GaN-HEMT, and the second MOS-FET may be disposed on the second GaN-HEMT.

Moreover, in the semiconductor device, the bypass capacitor may be resin-sealed along with the first GaN-HEMT, the second GaN-HEMT, the first MOS-FET and the second MOS-FET.

Moreover, in the semiconductor device, a sixth conductive pattern part formed on the insulating substrate;

a seventh conductive pattern part formed on the insulating substrate;

an eighth conductive pattern part formed on the insulating substrate;

a ninth conductive pattern part formed on the insulating substrate;

a third GaN-HEMT having a fifth GaN main electrode, a sixth GaN main electrode and a third GaN gate electrode and disposed on the sixth conductive pattern part;

a third MOS-FET having a fifth MOS main electrode, a sixth MOS main electrode and a third MOS gate electrode, the fifth MOS main electrode electrically connected to the sixth GaN main electrode;

a fourth GaN-HEMT having a seventh GaN main electrode, an eighth GaN main electrode and a fourth GaN gate electrode and disposed on the seventh conductive pattern part; and a fourth MOS-FET having a seventh MOS main electrode, an eighth MOS main electrode and a fourth MOS gate electrode, the seventh MOS main electrode electrically connected to the eighth GaN main electrode may be further included, wherein the fifth GaN main electrode of the third GaN-HEMT is electrically connected to the eighth conductive pattern part, the sixth MOS main electrode of the third MOS-FET is electrically connected to the ninth conductive pattern part, the seventh GaN main electrode of the fourth GaN-HEMT is electrically connected to the ninth conductive pattern part, and the eighth MOS main electrode of the fourth MOS-FET is electrically connected to the fifth conductive pattern part, and the first GaN-HEMT and the third GaN-HEMT are symmetrically disposed with the fifth conductive pattern part interposed therebetween, and the second GaN-HEMT and the fourth GaN-HEMT are symmetrically disposed with the fifth conductive pattern part interposed therebetween.

Moreover, in the semiconductor device, another bypass capacitor having a third electrode and a fourth electrode may be further included, wherein the third electrode is electrically connected to the eighth conductive pattern part, and the fourth electrode is electrically connected to the fifth conductive pattern part, and the bypass capacitor and the other bypass capacitor are symmetrically disposed with the fifth conductive pattern part interposed therebetween.

Advantageous Effects of Invention

In the semiconductor device according to the present invention, the first imaginary line extending along the first side of the first GaN-HEMT and the second imaginary line extending along the third side of the second GaN-HEMT intersect each other. Thereby, a bypass capacitor path can be made short, and a parasitic inductance in the bypass capacitor path can be reduced. In addition to this, in the semiconductor device according to the present invention, the metal wire electrically connecting the second GaN gate electrode of the second GaN-HEMT and the fifth conductive pattern part together is perpendicular to the fifth side of the second GaN-HEMT and the conductive pattern side of the fifth conductive pattern part. Thereby, the second GaN gate electrode is connected to the fifth conductive pattern part at the shortest distance, and the relevant metal wire can be made short. Therefore, according to the present invention, a malfunction of a power supply circuit having GaN-HEMTs can be suppressed.

DESCRIPTION OF EMBODIMENTS

Figure 1:
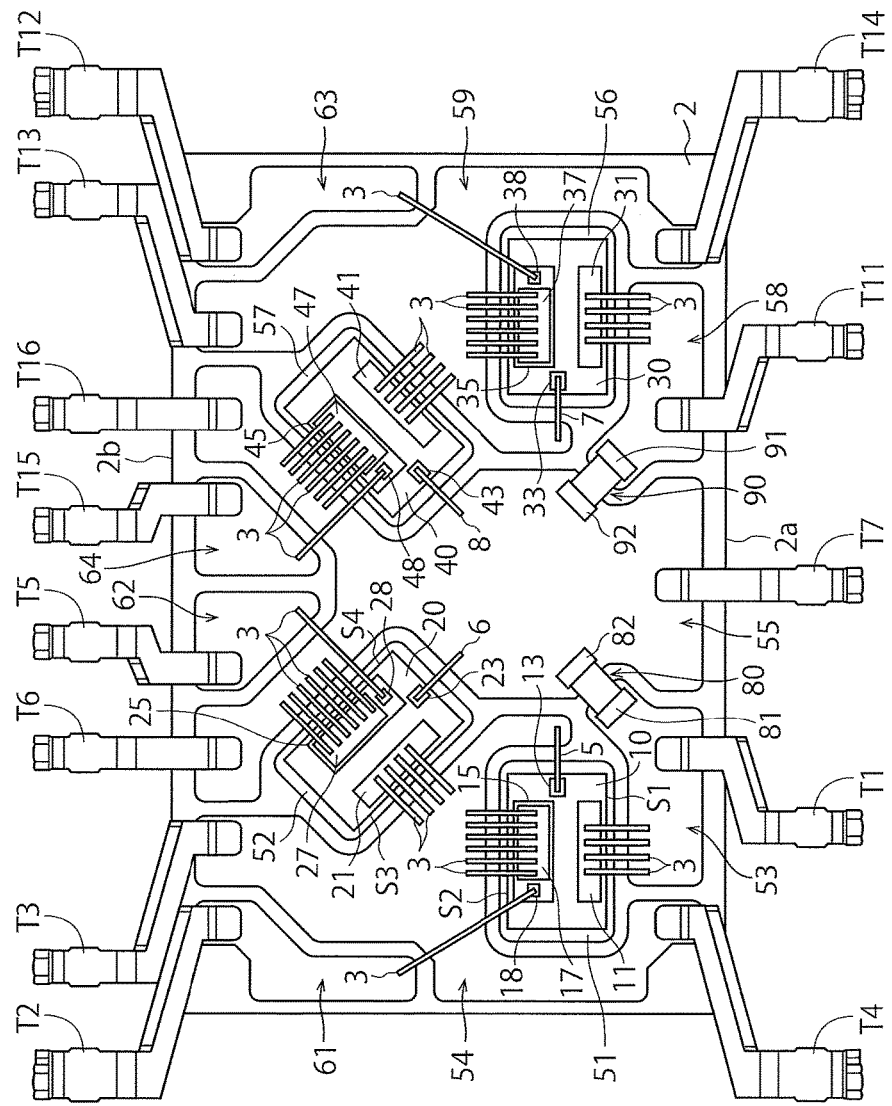
FIG. 1 is a plan view showing an internal configuration of a semiconductor device 1 according to an embodiment of the present invention.

Hereafter, a semiconductor device according to an embodiment of the present invention is described with reference to the drawings. Notably, constituents having the equivalent functions are given the same signs in the drawings.

Figure 3:
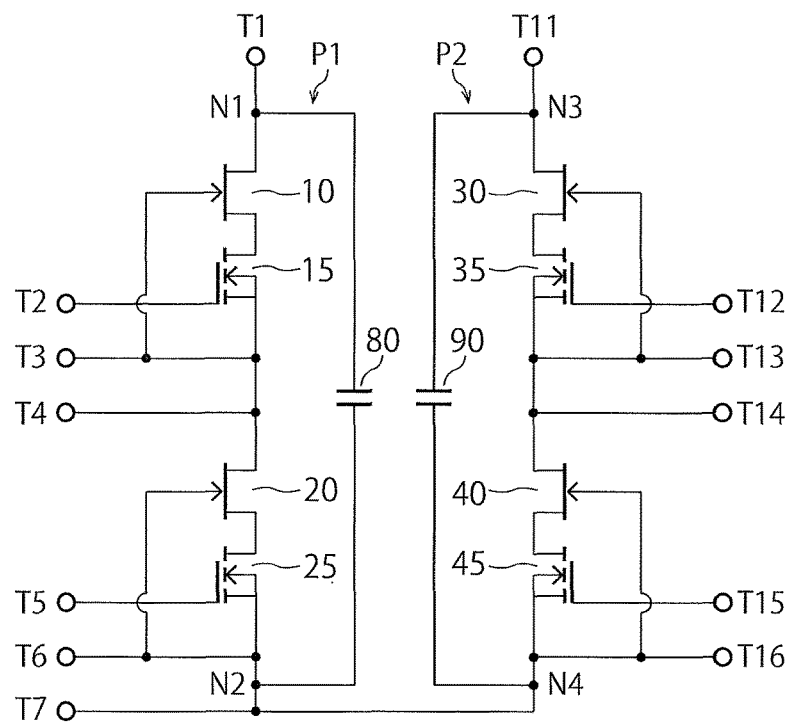
FIG. 3 is a circuit diagram of the semiconductor device 1 according to an embodiment of the present invention.

First, a circuit configuration of a semiconductor device 1 according to an embodiment of the present invention is described with reference to FIG. 3. As shown in FIG. 3, the semiconductor device 1 has a first half bridge circuit and a second half bridge circuit. The first half bridge circuit includes a high-side switching part constituted of a GaN-HEMT 10 and a MOS-FET 15 which are in cascade connection, and a low-side switching part constituted of a GaN-HEMT 20 and a MOS-FET 25 which are in cascade connection. The second half bridge circuit includes a high-side switching part constituted of a GaN-HEMT 30 and a MOS-FET 35 which are in cascade connection, and a low-side switching part constituted of a GaN-HEMT 40 and a MOS-FET 45 which are in cascade connection. The semiconductor device 1 functions, for example, as a DC/DC converter, a rectifier or an inverter.

As shown in FIG. 3, a bypass capacitor 80 is provided between a terminal T1 and a terminal T7, and a bypass capacitor 90 is provided between a terminal T11 and the terminal T7. The bypass capacitor 80 is provided between the drain electrode of the GaN-HEMT 10 and the source electrode of the MOS-FET 25. The bypass capacitor 90 is provided between the drain electrode of the GaN-HEMT 30 and the source electrode of the MOS-FET 45. Providing the bypass capacitors 80 and 90 as above forms a path from a node N1 to a node N2 via the bypass capacitor 80 (bypass capacitor path P1), and a path from a node N3 to a node N4 via the bypass capacitor 90 (bypass capacitor path P2). The bypass capacitors 80 and 90 are provided for preventing fluctuation in power supply voltage of the semiconductor device 1 and for removing various kinds of noise.

Notably, the capacitances of the bypass capacitors 80 and 90 are set to be values as large as possible at which the withstand voltages of the bypass capacitors are larger than the withstand voltages of the GaN-HEMTs 10, 20, 30 and 40.

Next, a specific configuration of the semiconductor device 1 is described with reference to FIG. 1 and FIG. 2.

The semiconductor device 1 includes an insulating substrate 2, the GaN-HEMTs 10, 20, 30 and 40 (first, second, third and fourth GaN-HEMTs), the MOS-FETs 15, 25, 35 and 45 (first, second, third and fourth MOS-FETs), the bypass capacitors 80 and 90, a resin-sealed part 95. As shown in FIG. 1, the semiconductor device 1 is configured to be in bilateral symmetry. A first half bridge circuit is formed on one side, and a second half bridge circuit is formed on the other side.

Moreover, the semiconductor device 1 further includes conductive pattern parts 51, 52, 53, 54, 55, 56, 57, 58 and 59 (first, second, third, fourth, fifth, sixth, seventh, eighth and ninth conductive pattern parts) and conductive pattern parts 61, 62, 63 and 64 which are formed on the insulating substrate 2. The conductive pattern parts 51 to 59 and 61 to 64 are formed, for example, by patterning the insulating substrate 2 with a copper foil. Detailed description of the individual conductive pattern parts is made later.

The insulating substrate 2 is composed of an insulating material, and, for example, composed of a material such as ceramics that is excellent in heat dissipation. As shown in FIG. 1, the insulating substrate 2 has a substrate side 2a (first substrate side) and a substrate side 2b (second substrate side) opposite to the substrate side 2a. The substrate sides 2a and 2b are sides from which various terminals of the semiconductor device 1 protrude in plan view. Namely, terminals T1, T4, T7, T11 and T14 protrude from the substrate side 2a in plan view, and terminals T2, T3, T5, T6, T12, T13, T15 and T16 protrude from the substrate side 2b in plan view. Notably, on the back surface of the insulating substrate 2, a conductive pattern part 65 connected to a radiator (not shown) such as a heat sink is formed so as to cover the back surface (see FIG. 5).

The GaN-HEMTs 10, 20, 30 and 40 are high electron mobility transistors for which a gallium nitride-based (GaN-based) semiconductor material is used. The GaN-HEMTs 10, 20, 30 and 40 are (so-called normally-on) transistors of a type where a channel exists even when a gate voltage is 0 V and a current flows therethrough.

The MOS-FETs 15, 25, 35 and 45 are field effect transistors (Field Effect Transistors: FETs) each having a MOS (Metal Oxide Semiconductor) structure. The MOS-FETs 15, 25, 35 and 45 are so-called normally-off transistors.

Figure 2:
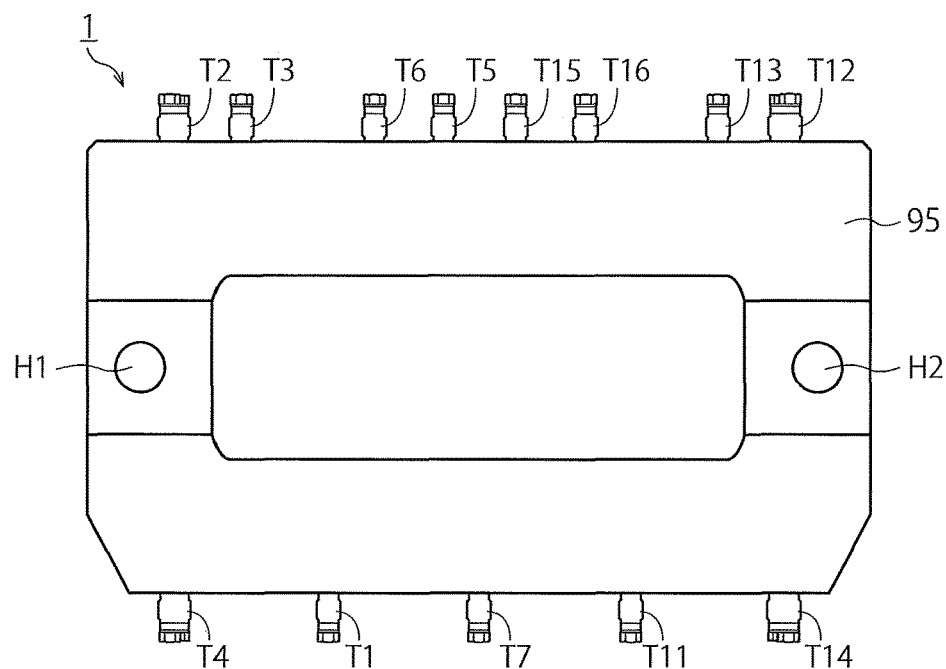
FIG. 2 is a view of an appearance of the semiconductor device 1 according to an embodiment of the present invention.

As shown in FIG. 1, the bypass capacitor 80 has an electrode 81 and an electrode 82. The bypass capacitor 90 has an electrode 91 and an electrode 92. The bypass capacitors 80 and 90 are resin-sealed with the resin-sealed part 95 along with the electronic components such as the GaN-HEMTs 10, 20, 30 and 40 and the MOS-FETs 15, 25, 35 and 45.

The semiconductor device 1 further includes the terminals T1, T2, T3, T4, T5, T6, T7, T11, T12, T13, T14, T15 and T16 for connection to external devices (IC chips such as a driver, and a power supply). These terminals are provided so as to come and protrude from the planes of FIG. 1 and FIG. 2. Inner leads of these terminals and portions other than the back surface of the insulating substrate 2 are resin-sealed with the resin-sealed part 95. Notably, as shown in FIG. 2, through holes H1 and H2 for inserting attachment screws therethrough are provided in the semiconductor device 1.

Here, details of the individual terminals of the semiconductor device 1 are described.

The terminals T1 and T11 are terminals connected to the high voltage side of a power supply (not shown) (high voltage-side terminals). Meanwhile, the terminal T7 is a terminal connected to the low voltage side (ground) of the power supply (low voltage-side terminal). Notably, when the power supply circuit of the semiconductor devices 1 functions as a rectifier, the terminal T1 and the terminal T11 are connected to a load on the output side.

The terminals T2 and T12 are terminals for inputting gate signals to high-side switches of the half bridge circuits therethrough. The terminal T2 is electrically connected to a gate electrode 18 of the MOS-FET 15, and the terminal T12 is electrically connected to a gate electrode 38 of the MOS-FET 35. The terminals T5 and T15 are terminals for inputting gate signals to low-side switches of the half bridge circuits therethrough. The terminal T5 is electrically connected to a gate electrode 28 of the MOS-FET 25, and the terminal T15 is electrically connected to a gate electrode 48 of the MOS-FET 45. These terminals T2, T5, T12 and T15 are electrically connected to a driver (not shown) driving the power supply circuit.

The terminal T3 is a terminal for monitoring a voltage between the MOS-FET 15 and the GaN-HEMT 20. Likewise, the terminal T13 is a terminal for monitoring a voltage between the MOS-FET 35 and the GaN-HEMT 40. The terminal T4 is a terminal for outputting an output voltage of the first half bridge circuit therethrough. Likewise, the terminal T14 is a terminal for outputting an output voltage of the second half bridge circuit. Notably, when the power supply circuit of the semiconductor device 1 functions as a rectifier, an AC power supply on the input side is connected between the terminal T4 and the terminal T14.

The terminal T6 is a terminal for monitoring a voltage between the MOS-FET 25 and the terminal T7. Likewise, the terminal T16 is a terminal for monitoring a voltage between the MOS-FET 45 and the terminal T7.

Next, the GaN-HEMTs 10, 20, 30 and 40 and the MOS-FETs 15, 25, 35 and 45 are described in detail.

Figure 4:
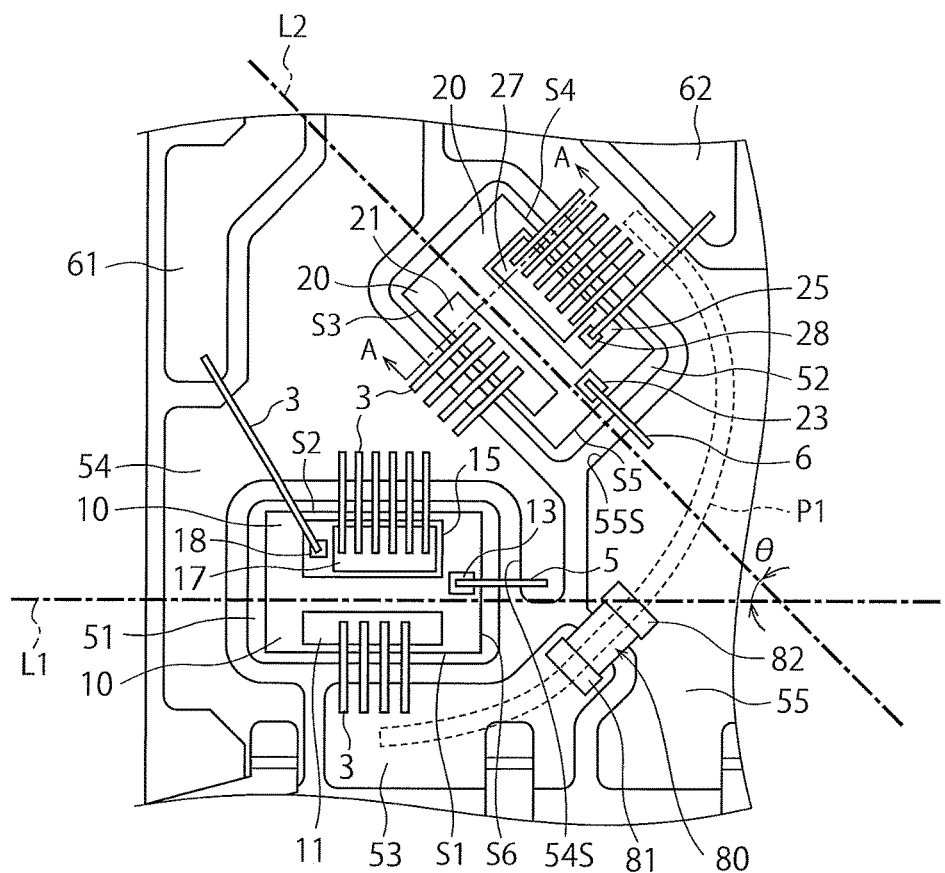
FIG. 4 is an expanded plan view of FIG. 1.
Figure 5:
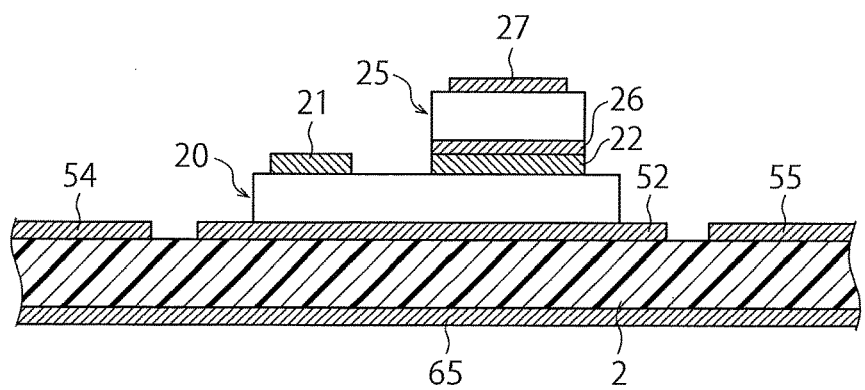
FIG. 5 is a cross-sectional view taken along the A-A line in FIG. 4.

The GaN-HEMTs 10, 20, 30 and 40 are N-type semiconductor devices each having a lateral structure, and on the upper face of each of them, a drain electrode, a source electrode and a gate electrode are provided. For example, as shown in FIG. 4 and FIG. 5, the GaN-HEMT 20 has a drain electrode 21 (third GaN main electrode), a source electrode 22 (fourth GaN main electrode) and a gate electrode 23 (second GaN gate electrode). Likewise, the GaN-HEMT 10 has a drain electrode 11 (first GaN main electrode), a source electrode (second GaN main electrode; not shown) and a gate electrode 13 (first GaN gate electrode). The GaN-HEMT 30 has a drain electrode 31 (fifth GaN main electrode), a source electrode (sixth GaN main electrode; not shown) and a gate electrode 33 (third GaN gate electrode). The GaN-HEMT 40 has a drain electrode 41 (seventh GaN main electrode), a source electrode (eighth GaN main electrode; not shown) and a gate electrode 43 (fourth GaN gate electrode).

Notably, the GaN-HEMTs 10, 20, 30 and 40 may have vertical structures. In this case, exemplarily stated for the GaN-HEMT 10, the drain electrode provided on the back surface of the GaN-HEMT 10 is connected to the conductive pattern part 51 via solder. The conductive pattern part 51 and the conductive pattern part 53 are joined together to be configured as an integrated conductive pattern part. Likewise also in the case of the GaN-HEMT 20, the drain electrode provided on the back surface of the GaN-HEMT 20 is connected to the conductive pattern part 52, and the conductive pattern part 52 and the conductive pattern part 55 are joined together.

The MOS-FETs 15, 25, 35 and 45 are N-type semiconductor devices each having a vertical structure. On the upper face of each of them, a source electrode and a gate electrode are provided, and on the lower face thereof, a drain electrode is provided. For example, as shown in FIG. 4 and FIG. 5, the MOS-FET 25 has a drain electrode 26 (third MOS main electrode), a source electrode 27 (fourth MOS main electrode) and the gate electrode 28 (second MOS gate electrode). Likewise, the MOS-FET 15 has a drain electrode (first MOS main electrode; not shown), a source electrode 17 (second MOS main electrode) and the gate electrode 18 (first MOS gate electrode). The MOS-FET 35 includes a drain electrode (fifth MOS main electrode; not shown), a source electrode 37 (sixth MOS main electrode) and the gate electrode 38 (third MOS gate electrode). The MOS-FET 45 includes a drain electrode (seventh MOS main electrode; not shown), a source electrode 47 (eighth MOS main electrode) and the gate electrode 48 (fourth MOS gate electrode).

As shown in FIG. 5, the MOS-FET 25 is disposed on the GaN-HEMT 20 such that the drain electrode 26 of the MOS-FET 25 is electrically connected to the source electrode 22 of the GaN-HEMT 20. Similarly to the MOS-FET 25, the MOS-FETs 15, 35 and 45 are disposed on the GaN-HEMTs 10, 30 and 40, respectively. Namely, the drain electrode of the MOS-FET 15 is electrically connected to the source electrode of the GaN-HEMT 10 via solder. The drain electrode of the MOS-FET 35 is electrically connected to the source electrode of the GaN-HEMT 30 via solder. The drain electrode of the MOS-FET 45 is electrically connected to the source electrode of the GaN-HEMT 40 via solder.

The drain electrode 11 of the GaN-HEMT 10 is electrically connected to the conductive pattern part 53 via a metal wire 3. Further, the drain electrode 11 is electrically connected to the high voltage-side terminal (terminal T1) via the conductive pattern part 53. The source electrode (not shown) of the GaN-HEMT 10 is connected to the drain electrode of the MOS-FET 15 via solder. The gate electrode 13 of the GaN-HEMT 10 is electrically connected to the conductive pattern part 54 via a metal wire 5. Further, this gate electrode 13 is electrically connected to the source electrode 17 of the MOS-FET 15 via the conductive pattern part 54.

The drain electrode 21 of the GaN-HEMT 20 is electrically connected to the conductive pattern part 54 via a metal wire 3. The source electrode of the GaN-HEMT 20 is connected to the drain electrode of the MOS-FET 25 via solder. The gate electrode 23 of the GaN-HEMT 20 is electrically connected to the conductive pattern part 55 via a metal wire 6. Further, this gate electrode 23 is electrically connected to the source electrode 27 of the MOS-FET 25 via the conductive pattern part 55.

The drain electrode 31 of the GaN-HEMT 30 is electrically connected to the conductive pattern part 58 via a metal wire 3. The source electrode of the GaN-HEMT 20 is connected to the drain electrode of the MOS-FET 35 via solder. The gate electrode 33 of the GaN-HEMT 30 is electrically connected to the conductive pattern part 59 via a metal wire 7. Further, the gate electrode 33 is electrically connected to the source electrode 37 of the MOS-FET 35 via the conductive pattern part 59.

The drain electrode 41 of the GaN-HEMT 40 is electrically connected to the conductive pattern part 59 via a metal wire 3. The source electrode of the GaN-HEMT 40 is connected to the drain electrode of the MOS-FET 45 via solder. The gate electrode 43 of the GaN-HEMT 40 is electrically connected to the conductive pattern part 55 via a metal wire 8. Further, the gate electrode 43 is electrically connected to the source electrode 47 of the MOS-FET 45 via the conductive pattern part 55.

The source electrode 17 of the MOS-FET 15 is electrically connected to the conductive pattern part 54 via a metal wire 3. The gate electrode 18 of the MOS-FET 15 is electrically connected to the conductive pattern part 61 via a metal wire 3.

The source electrode 27 of the MOS-FET 25 is electrically connected to the conductive pattern part 55 via a metal wire 3. This source electrode 27 is electrically connected to the low voltage-side terminal (terminal T7) via the conductive pattern part 55. The gate electrode 28 of the MOS-FET 25 is electrically connected to the conductive pattern part 62 via a metal wire 3.

The source electrode 37 of the MOS-FET 35 is electrically connected to the conductive pattern part 59 via a metal wire 3. The gate electrode 38 of the MOS-FET 35 is electrically connected to the conductive pattern part 63 via a metal wire 3.

The source electrode 47 of the MOS-FET 45 is electrically connected to the conductive pattern part 55 via a metal wire 3. The gate electrode 48 of the MOS-FET 45 is electrically connected to the conductive pattern part 64 via a metal wire 3.

Notably, while the metal wires 3 are aluminum wires (Al wires), they may be composed of another metal material. While the metal wires 5, 6, 7 and 8 are also aluminum wires (Al wires) in the present embodiment, they may be composed of another metal material to be used. The material of the metal wires 5, 6, 7 and 8 may be adapted to the material of the gate electrodes 13, 23, 33 and 43.

Notably, for electrically connecting the semiconductor switching parts and the conductive pattern parts together, in place of the metal wires, connectors composed of conductive plate materials may be used.

Next, referring to FIG. 1, the individual conductive pattern parts of the semiconductor device 1 are described in detail.

The conductive pattern parts 51, 52, 53, 54, 55, 61 and 62 are conductive pattern parts for constituting the first half bridge circuit. The conductive pattern parts 55, 56, 57, 58, 59, 63 and 64 are conductive pattern parts for constituting the second half bridge circuit. The conductive pattern part 55 is shared by the first half bridge circuit and the second half bridge circuit. Moreover, as shown in FIG. 1, the conductive pattern part 55 is formed to have a shape in bilateral symmetry.

The conductive pattern part 51 is a conductive pattern part for implementing the GaN-HEMT 10. Likewise, the conductive pattern part 52 is a conductive pattern part for implementing the GaN-HEMT 20. The conductive pattern part 56 is a conductive pattern part for implementing the GaN-HEMT 30. The conductive pattern part 57 is a conductive pattern part for implementing the GaN-HEMT 40.

In the present embodiment, as shown in FIG. 1, the conductive pattern parts 51, 52, 56 and 57 are formed to be substantially quadrangular in plan view to meet the shapes of the GaN-HEMTs 10, 20, 30 and 40. The GaN-HEMT 10 is disposed on the conductive pattern part 51. The GaN-HEMT 20 is disposed on the conductive pattern part 52. The GaN-HEMT 30 is disposed on the conductive pattern part 56. The GaN-HEMT 40 is disposed on the conductive pattern part 57.

To the conductive pattern part 53, the drain electrode 11 of the GaN-HEMT 10 is electrically connected via the metal wire 3, and the terminal T1 and the electrode 81 of the bypass capacitor 80 are connected via solder. Likewise, to the conductive pattern part 58, the drain electrode 31 of the GaN-HEMT 30 is electrically connected via the metal wire 3, and the terminal T11 and the electrode 91 of the bypass capacitor 90 are connected via solder.

The conductive pattern part 54 electrically connects the high-side switch (the GaN-HEMT 10 and the MOS-FET 15) and the low-side switch (the GaN-HEMT 20 and the MOS-FET 25) of the first half bridge circuit together. Moreover, to the conductive pattern part 54, the terminals T3 and T4 are electrically connected via solder. Moreover, to the conductive pattern part 54, one end of the metal wire 5 whose other end is connected to the gate electrode 13 of the GaN-HEMT 10 is connected.

Likewise, the conductive pattern part 59 electrically connects the high-side switch (the GaN-HEMT 30 and the MOS-FET 35) and the low-side switch (the GaN-HEMT 40 and the MOS-FET 45) of the second half bridge circuit together. Moreover, to the conductive pattern part 59, the terminal T13 and the terminal T14 are electrically connected via solder. Moreover, to the conductive pattern part 59, one end of the metal wire 7 whose other end is connected to the gate electrode 33 of the GaN-HEMT 30 is connected.

The electrode 82 of the bypass capacitor 80 is electrically connected to the conductive pattern part 55 via solder, and the source electrode 27 of the MOS-FET 25 is electrically connected thereto via the metal wire 3. Furthermore, the electrode 92 of the bypass capacitor 90 is electrically connected to the conductive pattern part 55 via solder, and the source electrode 47 of the MOS-FET 45 is electrically connected thereto via the metal wire 3. Moreover, the terminals T6, T7 and T16 are electrically connected to the conductive pattern part 55 via solder.

As shown in FIG. 1, to the conductive pattern part 55, the gate electrode 23 of the GaN-HEMT 20 is electrically connected via the metal wire 6, and the gate electrode 43 of the GaN-HEMT 40 is electrically connected via the metal wire 8.

The conductive pattern part 61 is a conductive pattern part for electrically connecting the gate electrode 18 of the MOS-FET 15 and the terminal T2 together. To this conductive pattern part 61, the gate electrode 18 is electrically connected via the metal wire 3, and the terminal T2 is electrically connected via solder. Likewise, the conductive pattern part 63 is a conductive pattern part for electrically connecting the gate electrode 38 of the MOS-FET 35 and the terminal T12 together. To this conductive pattern part 63, the gate electrode 38 is electrically connected via the metal wire 3, and the terminal T12 is electrically connected via solder.

The conductive pattern part 62 is a conductive pattern part for electrically connecting the gate electrode 28 of the MOS-FET 25 and the terminal T5 together. To this conductive pattern part 62, the gate electrode 28 is electrically connected via the metal wire 3, and the terminal T5 is electrically connected via solder. Likewise, the conductive pattern part 64 is a conductive pattern part for electrically connecting the gate electrode 48 of the MOS-FET 45 and the terminal T15 together. To this conductive pattern part 64, the gate electrode 48 is electrically connected via the metal wire 3, and the terminal T15 is electrically connected via solder.

Next, arrangement relation between the GaN-HEMT 10 and the GaN-HEMT 20 is described.

As shown in FIG. 4, the GaN-HEMT 10 and the GaN-HEMT 20 are substantially quadrangular in plan view. The GaN-HEMT 10 has a side S1 (first side) and a side S2 (second side) opposite to this side S1. In the present embodiment, the side S1 and the side S2 are substantially parallel to each other. Likewise, the GaN-HEMT 20 has a side S3 (third side) and a side S4 (fourth side) opposite to this side S3. In the present embodiment, the side S3 and the side S4 are substantially parallel to each other.

The drain electrode 11 of the GaN-HEMT 10 is provided along the side S1. Moreover, the source electrode 17 of the MOS-FET 15 is provided along the side S2. The drain electrode 21 of the GaN-HEMT 20 is provided along the side S3. Moreover, the source electrode 27 of the MOS-FET 25 is provided along the side S4.

As shown in FIG. 4, in the semiconductor device 1, an imaginary line L1 extending along the side S1 and an imaginary line L2 extending along the side S3 intersect each other. In other words, the imaginary line L1 and the imaginary line L2 are not parallel to each other. Thereby, as compared with the case where the GaN-HEMT 10 and the GaN-HEMT 20 are in parallel arrangement (that is, the case where the imaginary line L1 and the imaginary line L2 are parallel to each other), the bypass capacitor path P1 can be made short, and a parasitic inductance in the bypass capacitor path P1 can be reduced.

Notably, as an angle θ at which the imaginary line L1 and the imaginary line L2 intersect each other is larger, the length of the bypass capacitor path P1 is shorter, which suppresses the parasitic inductance more. However, this meanwhile causes the length of a path between the source electrode 17 of the MOS-FET 15 and the drain electrode 21 of the GaN-HEMT 20 to be longer, and a parasitic inductance in this path becomes larger, which leads to the cause of a malfunction of the power supply circuit. With such circumstances taken into consideration, the angle θ at which the imaginary line L1 and the imaginary line L2 intersect each other is preferably not less than 30° and not more than 135°, still preferably not less than 30° and nor more than 60°. In the present embodiment, the angle θ is substantially 45°.

As shown in FIG. 1, in the present embodiment, the high-side switch-side GaN-HEMT 10 is disposed such that the imaginary line L1 is substantially parallel to the substrate side 2*a* of the insulating substrate 2. The low-side switch-side GaN-HEMT 20 is disposed such that the imaginary line L2 is oblique to the substrate side 2*a* of the insulating substrate 2. Thereby, a space in an upper center region of the insulating substrate 2 can be easily secured. Namely, a region where the metal wires 3 connected to the source electrode 27 of the MOS-FET 25 are connected to the conductive pattern part 55, out of the conductive pattern part 55, can be made wide. As a result, the parasitic inductance in the bypass capacitor path P1 can be reduced.

Notably, as shown in FIG. 1, in the present embodiment, the semiconductor device 1 has a configuration in bilateral symmetry. Namely, the GaN-HEMT 10 and the GaN-HEMT 30 are symmetrically disposed with the conductive pattern part 55 interposed therebetween. The GaN-HEMT 20 and the GaN-HEMT 40 are symmetrically disposed with the conductive pattern part 55 interposed therebetween. The bypass capacitor 80 and the bypass capacitor 90 are also symmetrically disposed with the conductive pattern part 55 interposed therebetween. Further, the conductive pattern part 55 is shared by the two half bridge circuits. Such a configuration of the semiconductor device 1 in bilateral symmetry as above enables the conductive pattern part 55 to be wide, and parasitic inductances in the bypass capacitor paths P1 and P2 to be further reduced.

As shown in FIG. 4, the GaN-HEMT 20 has a side S5 (fifth side) connecting the side S3 and the side S4. The conductive pattern part 55 has a conductive pattern side 55S opposite to the side S5.

As shown in FIG. 4, the gate electrode 23 of the GaN-HEMT 20 is electrically connected to the conductive pattern part 55 via the metal wire 6. The metal wire 6 is perpendicular to the side S5 of the GaN-HEMT 20 and the conductive pattern side 55S of the conductive pattern part 55. Thereby, the gate electrode 23 is connected to the conductive pattern part 55 at the shortest distance, and the metal wire 6 can be made short. Notably, in the present application, the term "perpendicular" includes not only the case of intersection strictly at 90° but also the case of being substantially perpendicular for the purpose of allowing a tolerance and an error in production.

In the present embodiment, similarly to the metal wire 6, the metal wire 8 electrically connecting the gate electrode 43 of the GaN-HEMT 40 and the conductive pattern part 55 together is also configured so as to have the shortest length.

Notably, the same holds true for the case of using connectors in place of the metal wires 5, 6, 7 and 8. For example, in the case of using a connector in place of the metal wire 6, the gate electrode 23 of the GaN-HEMT 20 is electrically connected to the conductive pattern part 55 via the connector. This connector is perpendicular to the side S5 of the GaN-HEMT 20 and the conductive pattern side 55S of the conductive pattern part 55. Accordingly, generally speaking, a connection member such as a metal wire and a connector is provided so as to be perpendicular to the side S5 of the GaN-HEMT 20 and the conductive pattern side 55S of the conductive pattern part 55.

As described above, in the semiconductor device 1 of the present embodiment, the GaN-HEMT 10 and the GaN-HEMT 20 are disposed on the insulating substrate 2 such that the imaginary line L1 and the imaginary line L2 intersect each other. Thereby, the bypass capacitor path P1 can be made short, and the parasitic inductance in the bypass capacitor path P1 can be reduced. Furthermore, in the semiconductor device 1, the metal wire 6 electrically connecting the gate electrode 23 of the GaN-HEMT 20 and the conductive pattern part 55 together is substantially perpendicular to the side S5 of the GaN-HEMT 20 and the conductive pattern side 55S of the conductive pattern part 55. Thereby, the gate electrode 23 of the GaN-HEMT 20 is connected to the conductive pattern part 55 at the shortest distance by the metal wire 6. Making the metal wire 6 short as above can suppress the parasitic inductance in the metal wire 6. In the present embodiment, making both the length of the bypass capacitor path P1 and the length of the metal wire 6 short can suppress a malfunction of the GaN-HEMT 20. Therefore, according to the present embodiment, a malfunction of a power supply circuit having GaN-HEMTs can be suppressed.

As above, the semiconductor device according to the present embodiment has been described. Notably, not limited to the aforementioned half bridge circuit, the semiconductor device according to the present invention can also be applied to power supply circuits with other configurations, such as a full bridge circuit and a push-pull circuit, as long as each has semiconductor switching elements in cascade connection.

Notably, similarly also as to the GaN-HEMT 10, the metal wire 5 may be provided so as to have the shortest length, this metal wire 5 electrically connecting the gate electrode 13 to the conductive pattern part 54. Namely, as shown in FIG. 4, the metal wire 5 may be provided so as to be perpendicular to a side S6 connecting the side S1 and the side S2 and a conductive pattern side 54S opposite to the side S6. Thereby, a malfunction of the power supply circuit can be further suppressed.

Based on the aforementioned description, while those skilled in the art may conceive of additional effects and various alterations of the present invention, aspects of the present invention are not limited to the aforementioned individual embodiments. Components across different embodiments may be properly combined. Various additions, modifications and partial deletions may occur without departing from the conceptual ideas and spirit of the present invention derived from the contents and their equivalents as defined in the appended claims.

REFERENCE SIGNS LIST

1 Semiconductor device
2 Insulating substrate
2a, 2b Substrate side
3, 5, 6, 7, 8 Metal wire
10, 20, 30, 40 GaN-HEMT
11, 21, 31, 41 Drain electrode
22 Source electrode
13, 23, 33, 43 Gate electrode
15, 25, 35, 45 MOS-FET
26 Drain electrode
17, 27, 37, 47 Source electrode
18, 28, 38, 48 Gate electrode
51, 52, 53, 54, 55, 56, 57, 58, 59, 61, 62, 63, 64, 65 Conductive pattern part
54S, 55S Conductive pattern side
80, 90 Bypass capacitor
81, 82, 91, 92 Electrode
95 Resin-sealed part
H1, H2 Through hole
L1, L2 Imaginary line
N1, N2, N3, N4 Node
S1, S2, S3, S4, S5, S6 Side
T1, T2, T3, T4, T5, T6, T7, T11, T12, T13, T14, T15, T16 Terminal

The invention claimed is:
1. A semiconductor device comprising:
an insulating substrate;
a first conductive pattern part formed on the insulating substrate;
a second conductive pattern part formed on the insulating substrate;
a third conductive pattern part formed on the insulating substrate;

a fourth conductive pattern part formed on the insulating substrate;
a fifth conductive pattern part formed on the insulating substrate;
a first GaN-HEMT having a first GaN main electrode, a second GaN main electrode and a first GaN gate electrode and disposed on the first conductive pattern part;
a first MOS-FET having a first MOS main electrode, a second MOS main electrode and a first MOS gate electrode, the first MOS main electrode being electrically connected to the second GaN main electrode;
a second GaN-HEMT having a third GaN main electrode, a fourth GaN main electrode and a second GaN gate electrode and disposed on the second conductive pattern part;
a second MOS-FET having a third MOS main electrode, a fourth MOS main electrode and a second MOS gate electrode, the third MOS main electrode being electrically connected to the fourth GaN main electrode; and
a bypass capacitor having a first electrode and a second electrode,
the first GaN main electrode of the first GaN-HEMT being electrically connected to the third conductive pattern part, the second MOS main electrode of the first MOS-FET being electrically connected to the fourth conductive pattern part, the third GaN main electrode of the second GaN-HEMT being electrically connected to the fourth conductive pattern part, the fourth MOS main electrode of the second MOS-FET being electrically connected to the fifth conductive pattern part, the first electrode of the bypass capacitor being electrically connected to the third conductive pattern part, the second electrode of the bypass capacitor being electrically connected to the fifth conductive pattern part,
the first GaN-HEMT having a first side and a second side opposite to the first side, the second GaN-HEMT having a third side and a fourth side opposite to the third side,
the first GaN main electrode of the first GaN-HEMT being provided along the first side, the third GaN main electrode of the second GaN-HEMT being provided along the third side, a first imaginary line extending along the first side and a second imaginary line extending along the third side intersecting each other,
the second GaN-HEMT having a fifth side connecting the third side and the fourth side, the fifth conductive pattern part having a conductive pattern side opposite to the fifth side,
the second GaN gate electrode of the second GaN-HEMT being electrically connected to the fifth conductive pattern part via a connection member, the connection member being perpendicular to the fifth side and the conductive pattern side.

2. The semiconductor device according to claim 1, wherein the first GaN-HEMT and the second GaN-HEMT are normally-on transistors, and the first MOS-FET and the second MOS-FET are normally-off transistors.

3. The semiconductor device according to claim 1, wherein the connection member is a metal wire or a connector.

4. The semiconductor device according to claim 1, wherein the first GaN main electrode of the first GaN-HEMT is electrically connected to a high voltage-side terminal via the third conductive pattern part, and the fourth MOS main electrode of the second MOS-FET is electrically connected to a low voltage-side terminal via the fifth conductive pattern part.

5. The semiconductor device according to claim 4, wherein
the insulating substrate has a first substrate side from which the high voltage-side terminal and the low voltage-side terminal protrude in plan view, and a second substrate side opposite to the first substrate side, and
the first GaN-HEMT is disposed such that the first imaginary line is parallel to the first substrate side, and the second GaN-HEMT is disposed such that the second imaginary line is oblique to the first substrate side.

6. The semiconductor device according to claim 1, wherein an angle at which the first imaginary line and the second imaginary line intersect each other is not less than 30° and not more than 60°.

7. The semiconductor device according to claim 1, wherein an angle at which the first imaginary line and the second imaginary line intersect each other is 45°.

8. The semiconductor device according to claim 1, wherein
the first GaN-HEMT has a sixth side connecting the first side and the second side, and the fourth conductive pattern part has a conductive pattern side opposite to the sixth side, and
the first GaN gate electrode of the first GaN-HEMT is electrically connected to the fourth conductive pattern part via a connection member, and the connection member is perpendicular to the sixth side and the conductive pattern side.

9. The semiconductor device according to claim 1, wherein the first MOS-FET is disposed on the first GaN-HEMT, and the second MOS-FET is disposed on the second GaN-HEMT.

10. The semiconductor device according to claim 1, wherein the bypass capacitor is resin-sealed along with the first GaN-HEMT, the second GaN-HEMT, the first MOS-FET and the second MOS-FET.

11. The semiconductor device according to claim 1, further comprising:
a sixth conductive pattern part formed on the insulating substrate;
a seventh conductive pattern part formed on the insulating substrate;
an eighth conductive pattern part formed on the insulating substrate;
a ninth conductive pattern part formed on the insulating substrate;
a third GaN-HEMT having a fifth GaN main electrode, a sixth GaN main electrode and a third GaN gate electrode and disposed on the sixth conductive pattern part;
a third MOS-FET having a fifth MOS main electrode, a sixth MOS main electrode and a third MOS gate electrode, the fifth MOS main electrode electrically connected to the sixth GaN main electrode;
a fourth GaN-HEMT having a seventh GaN main electrode, an eighth GaN main electrode and a fourth GaN gate electrode and disposed on the seventh conductive pattern part; and
a fourth MOS-FET having a seventh MOS main electrode, an eighth MOS main electrode and a fourth MOS gate electrode, the seventh MOS main electrode electrically connected to the eighth GaN main electrode, wherein the fifth GaN main electrode of the third GaN-HEMT is electrically connected to the eighth conductive pattern part, the sixth MOS main electrode of the third MOS-FET is electrically connected to the ninth conductive pattern part, the seventh GaN main electrode of the fourth GaN-HEMT is electrically connected to the ninth conductive pattern part, and the eighth MOS main electrode of the fourth MOS-FET is electrically connected to the fifth conductive pattern part, and the first GaN-HEMT and the third GaN-HEMT are symmetrically disposed with the fifth conductive pattern part interposed therebetween, and the second GaN-HEMT and the fourth GaN-HEMT are symmetrically disposed with the fifth conductive pattern part interposed therebetween.

12. The semiconductor device according to claim 11, further comprising
    another bypass capacitor having a third electrode and a fourth electrode, wherein
    the third electrode is electrically connected to the eighth conductive pattern part, and the fourth electrode is electrically connected to the fifth conductive pattern part, and
    the bypass capacitor and the other bypass capacitor are symmetrically disposed with the fifth conductive pattern part interposed therebetween.

* * * * *

UNITED STATES PATENT AND TRADEMARK OFFICE
CERTIFICATE OF CORRECTION

| | |
|---|---|
| PATENT NO. | : 10,199,486 B2 |
| APPLICATION NO. | : 15/738437 |
| DATED | : February 5, 2019 |
| INVENTOR(S) | : Morinaga et al. |

It is certified that error appears in the above-identified patent and that said Letters Patent is hereby corrected as shown below:

On the Title Page

Item (87), the PCT Publication information has been omitted. Item (87) should read:
--(87) PCT Pub. No.: WO2018/235137 PCT Pub. Date: Dec. 27, 2018--

Signed and Sealed this
Thirty-first Day of December, 2019

Andrei Iancu
*Director of the United States Patent and Trademark Office*